US 9,059,850 B2

(12) United States Patent
Wang

(10) Patent No.: US 9,059,850 B2
(45) Date of Patent: Jun. 16, 2015

(54) DATA ALIGNMENT OVER MULTIPLE PHYSICAL LANES

(71) Applicant: Broadcom Corporation, Irvine, CA (US)

(72) Inventor: Zhongfeng Wang, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/655,748

(22) Filed: Oct. 19, 2012

(65) Prior Publication Data

US 2013/0262941 A1 Oct. 3, 2013

Related U.S. Application Data

(60) Provisional application No. 61/617,365, filed on Mar. 29, 2012.

(51) Int. Cl.
| | |
|---|---|
| *G11C 29/00* | (2006.01) |
| *H04L 1/20* | (2006.01) |
| *H03M 13/37* | (2006.01) |
| *H04L 25/14* | (2006.01) |
| *H04L 7/04* | (2006.01) |

(52) U.S. Cl.
CPC ........... *H04L 1/203* (2013.01); *H03M 13/3761* (2013.01); *H04L 7/048* (2013.01); *H04L 25/14* (2013.01)

(58) Field of Classification Search
CPC ........... H04L 43/00; H04L 1/24; H04L 1/203; H04L 25/14; H04L 7/048; H04J 3/14; G06F 11/07; G06F 11/1008; G06F 11/1076; G11C 29/00; H03M 13/3761

USPC .................... 714/712, 773, E11.024
See application file for complete search history.

(56) References Cited

U.S. PATENT DOCUMENTS

| 5,276,691 | A | * | 1/1994 | Kivari ........................... 714/798 |
|---|---|---|---|---|
| 5,544,180 | A | * | 8/1996 | Gupta ........................... 714/798 |
| 5,592,518 | A | * | 1/1997 | Davis et al. ................... 375/368 |
| 5,742,644 | A | * | 4/1998 | Campana, Jr. ................. 375/316 |
| 5,872,518 | A | * | 2/1999 | Kushita .......................... 340/2.1 |
| 5,995,512 | A | * | 11/1999 | Pogue, Jr. ...................... 370/419 |
| 6,169,581 | B1 | * | 1/2001 | Conover ........................ 348/525 |
| 6,411,614 | B1 | * | 6/2002 | Weigand ....................... 370/347 |
| 6,590,872 | B1 | * | 7/2003 | Shiue et al. ................... 370/314 |
| 7,444,558 | B2 | * | 10/2008 | Mitbander et al. ............ 714/716 |
| 8,385,374 | B1 | * | 2/2013 | Wohlgemuth ................. 370/509 |
| 2003/0046618 | A1 | * | 3/2003 | Collins ......................... 714/700 |
| 2003/0099260 | A1 | * | 5/2003 | Bunton ......................... 370/535 |
| 2003/0217215 | A1 | * | 11/2003 | Taborek et al. ............... 710/305 |
| 2003/0219236 | A1 | * | 11/2003 | Noro ............................. 386/124 |
| 2005/0154946 | A1 | * | 7/2005 | Mitbander et al. ............ 714/724 |

(Continued)

OTHER PUBLICATIONS

Gary Nicholl, "A Physical Coding Sublayer for 100 GBE", IEEE Applications & Practice, Dec. 2007, pp. 4-10.*

(Continued)

*Primary Examiner* — Albert Decady
*Assistant Examiner* — Enamul M Kabir
(74) *Attorney, Agent, or Firm* — Brinks Gilson & Lione

(57) ABSTRACT

High speed communication networks divide data traffic into multiple physical lanes. For example, the IEEE standard 40 G/100 G supports sending Ethernet frames at 40/100 gigabits per second over multiple 10/25 Gb/s lanes. Techniques are disclosed for aligning the data across the physical lanes.

20 Claims, 14 Drawing Sheets

(56) References Cited

U.S. PATENT DOCUMENTS

| | | | |
|---|---|---|---|
| 2005/0188146 A1* | 8/2005 | Teo | 711/5 |
| 2006/0187909 A1* | 8/2006 | Sho et al. | 370/389 |
| 2007/0140361 A1* | 6/2007 | Beales | 375/259 |
| 2009/0274247 A1* | 11/2009 | Galbraith et al. | 375/341 |
| 2010/0229067 A1* | 9/2010 | Ganga et al. | 714/752 |
| 2010/0229071 A1* | 9/2010 | Ganga et al. | 714/776 |
| 2010/0289955 A1* | 11/2010 | Kobayashi | 348/537 |

OTHER PUBLICATIONS

IEEE Computer Society, IEEE 802.3ba, Part 3: Carrier Sense Multiple Access with Collision Detection (CSMA/CD) Access Method and Physical Layer Specifications, The Institute for Electrical and Electronics Engineers (IEEE), New York, NY, Jun. 22, 2010.

Mark Gustlin, 40 and 100 Gigabit Ethernet PCS and PMA Overview, IEEE ComSocSCV, Oct. 2010, 16 pages, Santa Clara, California.

Stephen Bates, et al., Backplane NRZ FEC Baseline Proposal, IEEE 802.3bj, Mar. 2012, 22 pages.

\* cited by examiner

DATA ALIGNMENT OVER MULTIPLE PHYSICAL LANES

1. CROSS REFERENCE TO RELATED APPLICATIONS

This application claims priority to, and incorporates by reference, provisional application No. 61/617,365, filed 29 Mar. 2012.

2. TECHNICAL FIELD

This disclosure relates to high speed computer networks that send data over multiple different physical channels.

3. BACKGROUND

High speed communication networks divide data traffic into multiple physical lanes. For example, the IEEE standard 100 G supports sending Ethernet frames at 40 and 100 gigabits (Gb/s) over multiple 10 Gb/s or 25 Gb/s lanes. Aligning the data across the lanes at the receiver is significant challenge.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Described below are techniques for efficient alignment of data over multiple physical lanes. Such techniques may be applied to high speed communication networks, such as those adhering to the IEEE standard 100 G(4×25 G) backplane and copper cable systems, and other types of networks. More generally, the techniques may be applied to aligning data sent by any source communication system in which multiple communication channels each carry a portion of the original data to a destination system.

Some of the examples below assume an input bit-error-rate (BER) that is relatively high, e.g., BERin=2e−5. However, the analysis may be done for any other BER. The analysis results may then be a parameter that drives selection of an alignment technique that meets sufficiently low false alignment probabilities, mean time to lock, and worst case lock time.

Figure 1:
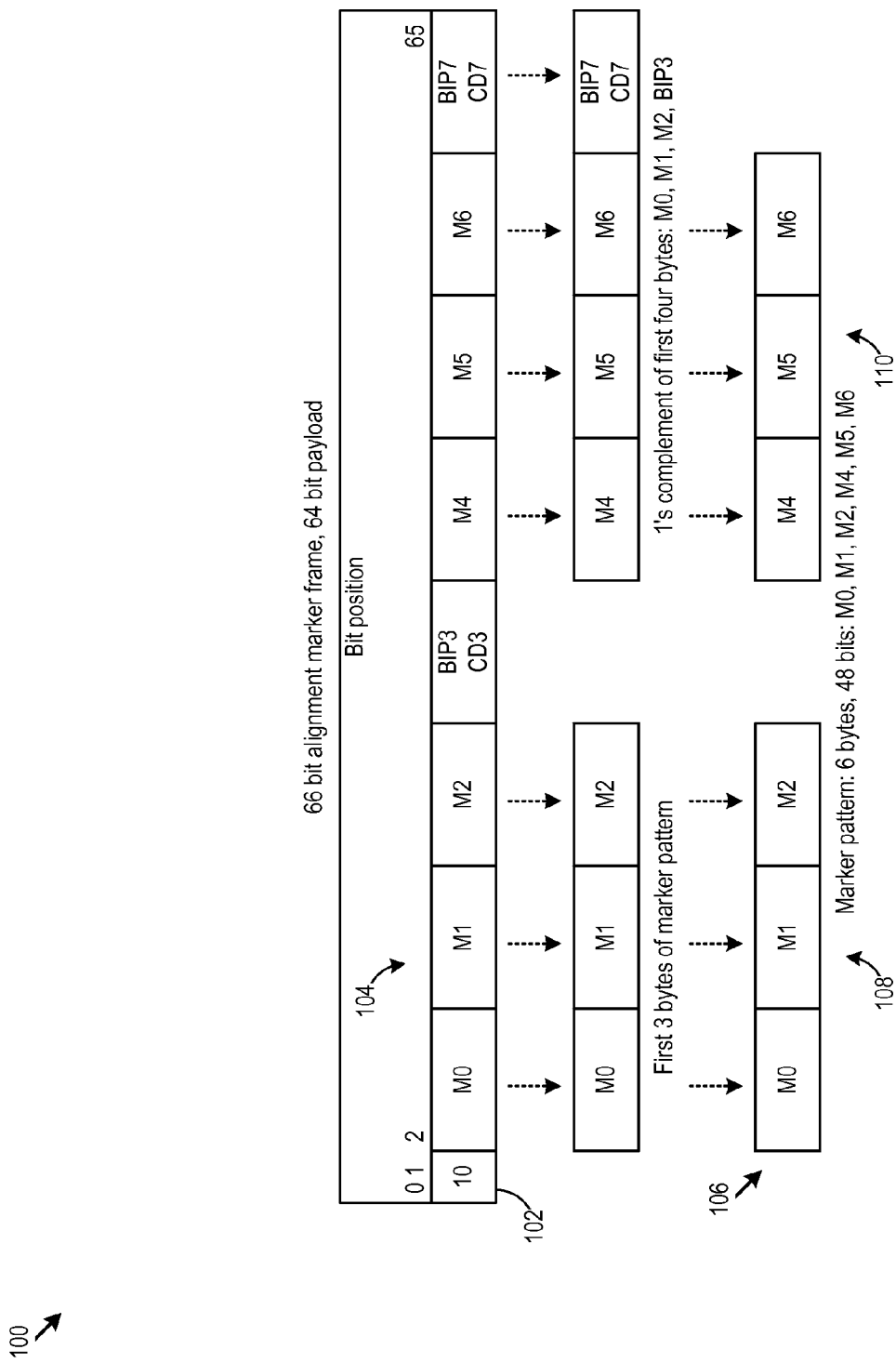
FIG. 1 shows an example data pattern of an Align Marker (AM) block.

FIG. 1 shows an example data pattern of an Align Marker block (AM) 100. The AM block 100 includes two start bits 102, and an eight byte (8 B), 64 bit (64 b) payload 104. The start bits 102 may be a preselected pattern, e.g., "10" to flag the following 64 b as part of an AM block. The start bits 102 may be omitted. Interleaved parity (e.g., BIP3 and BIP7) may also be present in the AM block 100.

Inside the AM block 100 is a marker pattern. The marker pattern facilitates the alignment (sometimes also referred to as deskew) of the data sent over multiple lanes. The marker pattern may take many different forms and have many different lengths. In the example shown in FIG. 1, the marker pattern (MP) 106 is 6 B or 48 b, distributed over the bytes M0, M1, M2, M4, M5, and M6. Further, in the example shown in FIG. 1, the bytes M4, M5, M6 are the one's complement of the bytes M0, M1, M2.

The MP 106 may have a fixed value per lane. The number of unique MPs may vary depending on the implementation. For example, for 100 Gb/s, there may be 4 physical lanes, each carrying 5 virtual channels, for 20 total channels of data. Each of the 20 channels may have a unique MP 106 that identifies that channel. In a 40 Gb/s system, there may be four lanes each carrying one channel of data, and 4 unique MPs.

The source communication system inserts MPs periodically. For example, the communication system may insert MPs every 4,096, 16K, or other number of blocks (e.g., Forward Error Correcting (FEC) blocks) on each lane at the same time. This interrupts transmission of the source data, but adds the alignment information that the destination system will use to align the data sent over multiple different physical channels. Each physical channel has a latency that differs from other physical channels. Accordingly, a way to align the received data is needed.

In some implementations, the alignment techniques may the M0, M1, M2, M4, M5, and M6 data of the MP 106. Several different techniques for accomplishing this are described below. The techniques avoid finding an exact match for all 48 b of the MP 106, but still provide sufficiently robust false alignment probabilities, mean time to lock, and worst case lock time. Trying to find an exact match for all 48 b of the MP 106 can, when input BER is relatively high, result in very long worst case lock times.

As an overview, one technique for reducing lock time in the worst case at high BER is to tolerate some number of bit errors when matching a 48 b MP within a 64 b AM block 100.

For instance, the destination system may still recognize a "match" when the total number of unmatched bits between the incoming block and the template is less than a match threshold, such as 3 bits. On the other hand, once the bit error tolerance in the block match process is increased, the probability of false alignment may increase as well. To mitigate false alignment, the techniques described below may implement specific lock criterion. For instance, instead of claiming a lock after finding 2 consecutive matched blocks, the destination system may implement a lock criterion of claiming a match after finding 1 matched block, 2 consecutive matched blocks, 3 consecutive matched blocks, or any other number of consecutive or non-consecutive matched blocks.

In one implementation, the techniques tolerate symbol errors instead of tolerating bit errors. Tolerating symbol errors may reduce the lock time when error propagation occurs. Symbol definitions at the destination system may vary. As examples, the destination system may consider a symbol to be a group of 2 consecutive bits, 3 consecutive bits, 4 consecutive bits, a group of 6 bits, a group of 8 bits, or some other predefined number of grouped bits. The bits in the symbol need not be consecutive bits from the MP 106.

Three examples of alignment techniques that the destination may implement are:

Technique 1: Tolerating 4 bit errors in matching the 48 b MP 106;

Technique 2: Tolerating 3 half-byte errors in matching the 48 b MP 106; and

Technique 3: Tolerating 4 half-byte errors in matching the 48 b MP 106.

Figure 2:
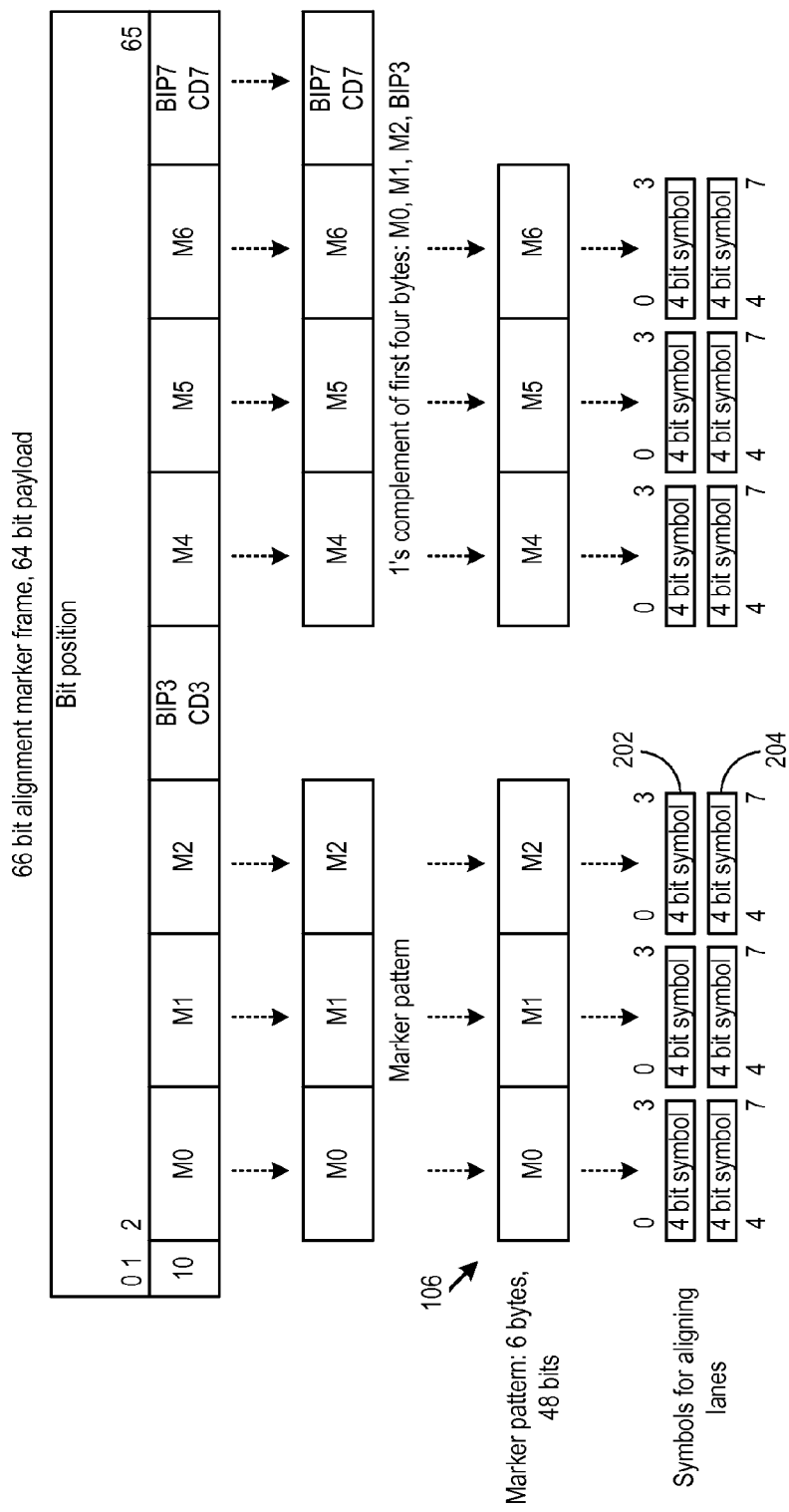
FIG. 2 shows an example division of 24 b segments of a marker pattern into six groups of bits, resulting in 12 total symbols.

With respect to FIG. 2, in technique 2, a 24 b segment, such as segment 108 of M0, M1, and M2, and segment 110 of M4, M5, and M6 may be divided into 6 groups. Each group in this example is a four bit symbol. For example, the alignment technique treats M0, M1, and M2 as two symbols each formed from bits 0 to 3, and 4 to 7. In FIG. 2, the two symbols for M2 are labeled 202 and 204.

Figure 3:
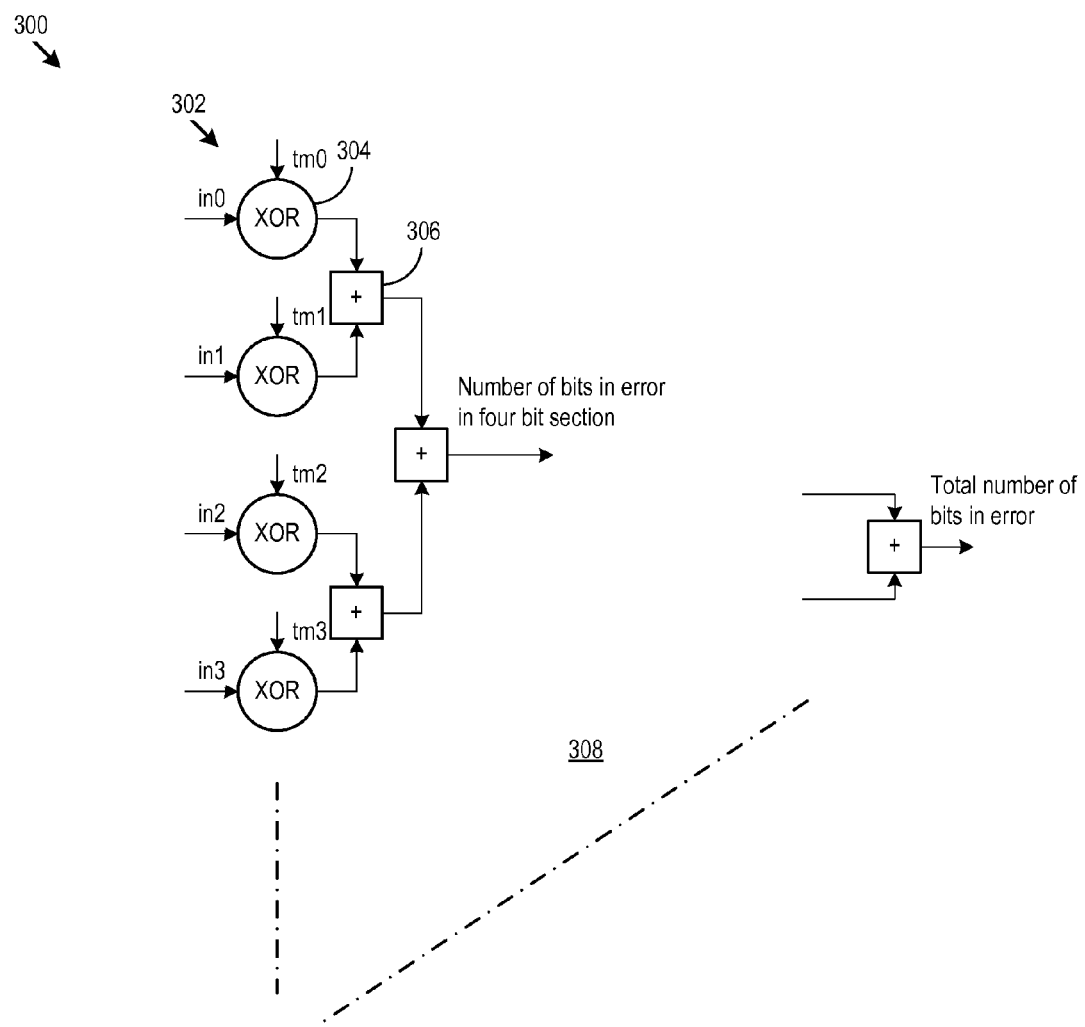
FIG. 3 shows a logic implementation for counting a total number of unmatched bits in a marker pattern.

Technique 2 has less implementation complexity than technique 1. FIG. 3 shows a logic implementation 300 for counting a total number of unmatched bits in the MP 106. The logic implementation 300, for example, includes a logic section 302 that compares a template pattern (tm[i]) for the MP for which the destination is searching against the input bits (in[i]). The XOR logic 304 finds mismatches between the template and the input bits, and the summers 306 add up the total number of mismatches. A set of logic sections and cascaded summers 308 may be formed that span 48 b across the input bits in a search for the MP template. The destination may search for any desired template patterns each time a new input bit is received that then shifts the current set of 48 b by one bit.

Figure 4:
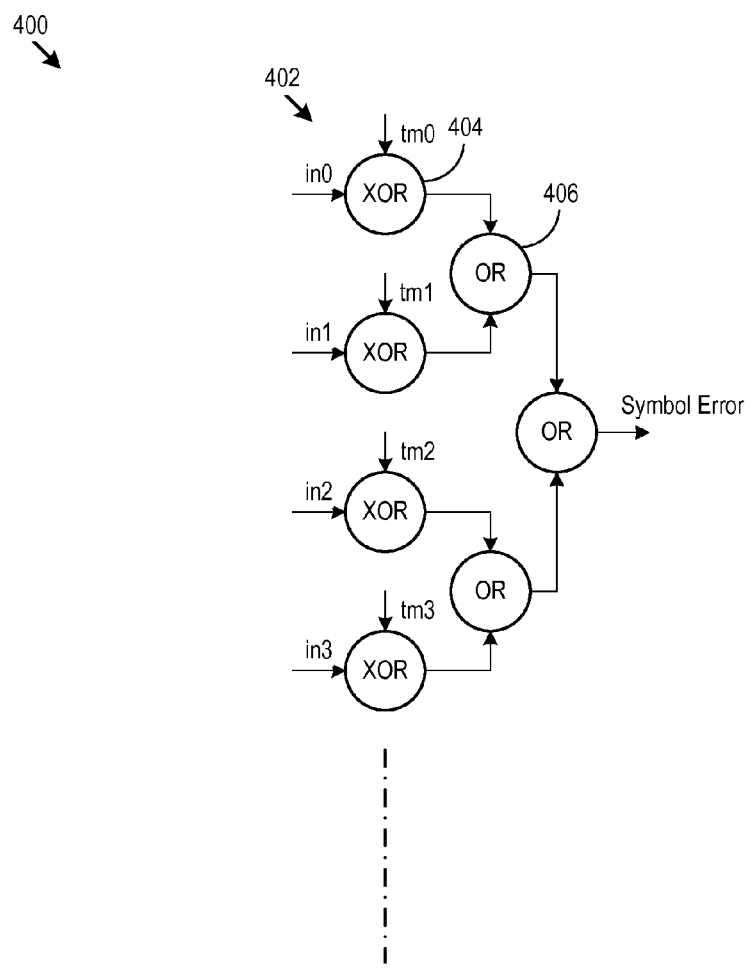
FIG. 4 shows a logic implementation for determining a total number of unmatched symbols in a marker pattern.

In comparison, FIG. 4 shows a logic implementation 400 for determining a total number of unmatched symbols in the MP 106. The logic implementation 400, for example, includes a set of logic sections 402 that compares a template pattern (tm[i]) for the MP for which the destination is searching against the input bits (in[i]). The logic section 402 determines, without using more complex adders, whether any four bit symbol is in error, because any bit in the set of four bits in the symbol does not match the template.

False Alignment Probability

Technique 1:

$Pfa=(nchoosek(48,4)*2^{-44})^2=1.22e-16$, indicating a mean time of 1.4e4 years for a false alignment for the 100 Gb/s case.

Where Pfa refers to the false alignment probability, and nchoosek refers to n choose k, and 4 choose 48 is the number of ways to find four mismatched bits in a 48 b MP pattern. The factor $2^{-44}$ (two to the power minus 44) represents the chance of matching 44 input bits against the remaining 44 bits in the MP template for which the destination is searching. Recall that the destination may search for two, three of any other number of consecutive matches before declaring a lock. In this example, the destination searches for two consecutive matched blocks, and thus the probability of finding two consecutive mismatched blocks is $nchoosek(48,4)*2^{-44}$ squared.

If the destination implements a lock criteria that is 3 consecutive matched blocks, then the probability of false alignment decreases to:

$Pfa=(nchoosek(48,4)*2^{-44})^3=1.35e-24$, indicating a mean time of 1.27e12 years for the 100 Gb/s case.

Technique 2:

$Pfa=(nchoosek(12,3)*2^{-36})^2=1.02e-17$, indicating a mean time of 1.7e5 years for the 100 Gb/s case.

If the destination implements of lock criteria that is 3 consecutive matched blocks, then the probability of false alignment decreases to:

$Pfa=(nchoosek(12,3)*2^{-36})^3=3.28e-26$, indicating a mean time of 5.2e15 years for the 100 Gb/s case.

Technique 3:

$Pfa=(nchoosek(12,4)*2^{-32})^2=1.32e-14$, indicating a mean time of 130 years for the 100 Gb/s case.

Mean Time of Lock

The following discussion assumes a lock criteria of two successive matches, and an error propagation probability of 0.4. In other words, if there is a single bit error, there is a 40% of chance that there will be 2 consecutive bit errors. Below, the parameter 'ei' refers to input bit error rate (BER) at the input side of the block match process. Similar calculations may be done for any desired error propagation probability, and for other lock criteria.

Technique 1:

$PI3=P(lock\ in\ 2\ matches)=(1-nchoosek(44,1)*ei*0.4^4))^2=1-4.5e-5$, where 'ei' denotes input bit error rate at the block match point.

Mean time of $lock=0.5+1*PI3+2*(1-PI3)*PI3+3*(1-PI3)^3*PI3+\ldots$, which is approximately 1.5+4.5e−5 group delays.

If the destination implements a lock criteria that is 3 consecutive matched blocks, then:

$PI3=P(lock\ in\ 3\ matches)=(1-nchoosek(44,1)*ei*0.4^4))^3=1-6.76e-5$.

Figure 5:
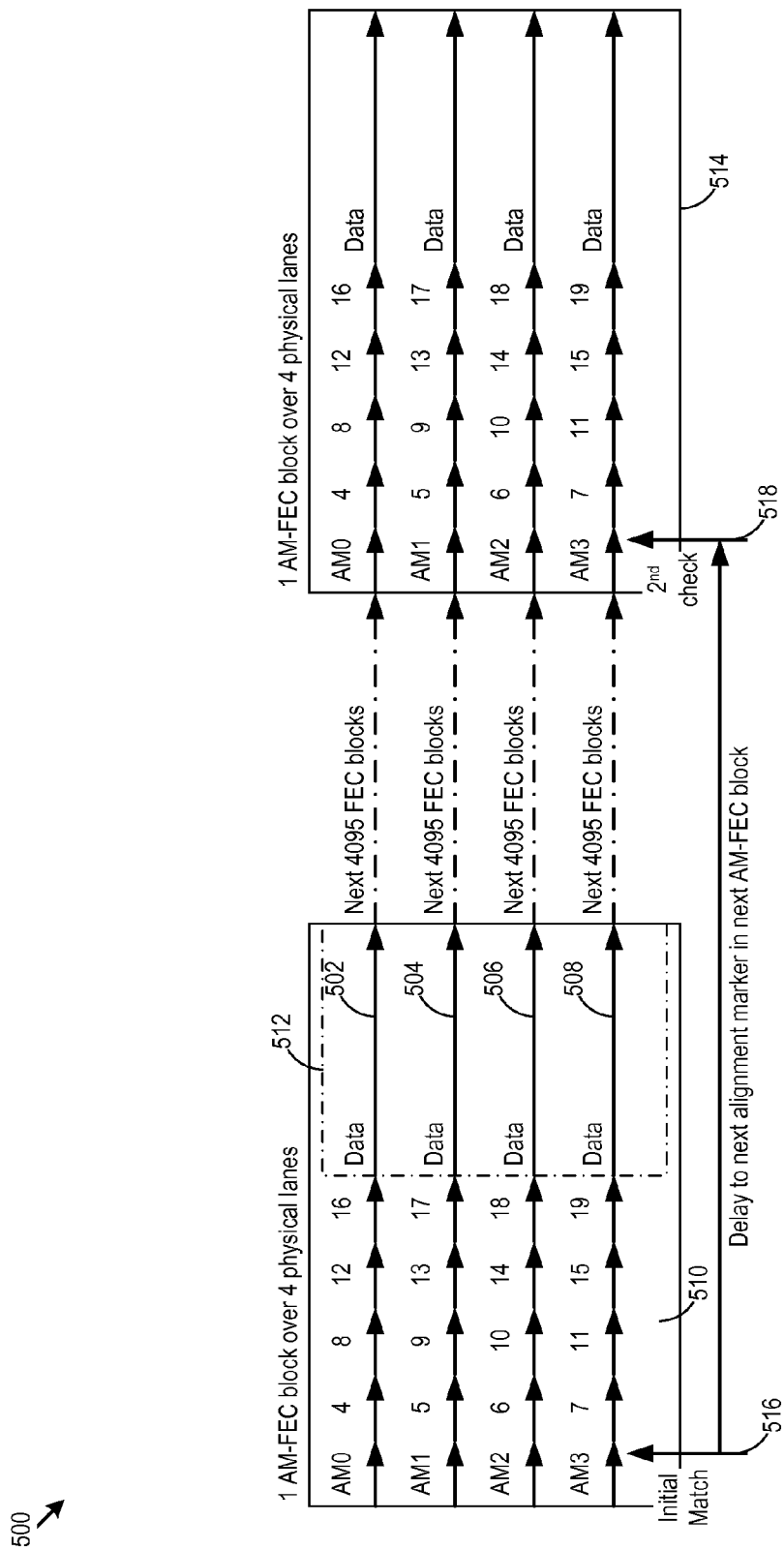
FIG. 5 shows an example matching sequence for matching blocks in a scenario with four physical lanes and 20 virtual lanes of traffic.

Mean time of $lock=1*PI3+2*(1-PI3)*PI3+3*(1-PI3)^3*PI3+\ldots$, which is approximately 1+6.76e−5 group delay, where one group delay is the time between two consecutive groups of AM blocks (see, for example, FIG. 5).

Technique 2:

$P(lock\ in\ 2\ matches)=(1-2*3*ei*(0.4^{12}+0.4^{11}+0.4^{10}+0.4^9))^2=1-1.0e-7$.

Mean time of lock is ~=1.5+1.0e−7 group delay.

If the destination implements a lock criteria that is 3 consecutive matched blocks, then:

P(lock in 3 matches)=1−2.04e−7.

Mean time of lock is ~=1+2.04e−7 group delay.

Technique 3:

$P(lock\ in\ 2\ matches)=(1-2*2*ei*(0.4^{16}+0.4^{15}+0.4^{14}+0.4^{13}))^2=1-1.7e-9$.

Mean time of lock ~=1.5+1.7e−9 group delay.

Lock Time in the Worst Case

Below are some examples of calculating worst case lock time for realistic scenarios. Here, it is assumed that the system only checks for a block match of one AM block per group of AM blocks.

Technique 1:
The probability of not aligning in 5 groups is:
$(4.5\textasciicircum-5)\textasciicircum 5=1.85e-22$.
One realistic worst case scenario is:
----v----x----v----x----v----x----v----x----v----
where 'v' indicates a block match, 'x' indicates no match, and the '----' indicates data transmission between two consecutive groups of AM blocks.

For this scenario, the longest lock time will be 10 group delays.

Technique 2:
The probability of not aligning in 3 groups is:
$(1.0\textasciicircum-7)\textasciicircum 3=1.0e-21$, which corresponds to a mean time of 1.7e9 years.
One realistic worst case scenario is:
----v----x----v----x----v----
For this scenario, the longest lock time will be 6 group delays.

Technique 3:
The probability of not aligning in 2 groups is:
$(1.7\textasciicircum-9)\textasciicircum 2=2.9e-18$, which corresponds to a mean time of 5.9e5 years.
One realistic worst case scenario is:
----v----x----v----v
For this scenario, the longest lock time will be 4 group delays.

The above analysis shows that with Technique 2, the worst case lock time is 6 group delays while for Technique 1, it is 10 group delays.

Alignment Marker Match Sequence

FIG. 5 shows an example matching sequence 500 for matching blocks in a scenario with four physical lanes 502, 504, 506, and 508 and 20 virtual lanes of traffic. AM0, 4, 8, 12, 16 represents the five unique MPs that identify five virtual lanes of data traffic over the first physical lane 502. AM1, 5, 9, 13, 17 represents the unique MPs that identify five more virtual lanes of data traffic over the second physical lane 504. AM2, 6, 10, 14, 18 represents the unique MPs that identify five more virtual lanes of data traffic over the third physical lane 506. AM3, 7, 11, 15, 19 represents the unique MPs that identify the last five virtual lanes of data traffic over the fourth physical lane 508.

FIG. 5 shows that the AMs are carried to the destination in lower layer protocol frames. In FIG. 5, the lower layer protocol frame is an FEC block, e.g., the FEC block 510. The FEC block carries the AMs, but the much of the FEC block is source data 512. Because the source data is spread across four physical lanes, and the lanes will have different latency characteristics, the destination searches for the marker patterns in the AMs to align the data across the lanes. Recall that FEC blocks may only include AMs on a periodic basis, such as once every 4,096 FEC blocks. Thus, only some FEC blocks include AM blocks. Those FEC blocks that include AM blocks are referred to as AM-FEC blocks.

There are twenty different MPs that the destination may search for to find an initial match. In the example of FIG. 5, the destination has found an initial match 516 on the first AM position on the fourth physical lane 508, which corresponds to AM3 and the fourth virtual lane. In the sequence 500, once the destination finds an initial match, the match sequence may select a second check point 518 that is, for example, the also the first AM position in the next consecutive AM-FEC block 514 that carries AMs.

If a match is found for the MP at the second check point 518 (thereby locating two consecutive MPs), then the destination may consider that a lock has been established for that lane. The destination may establish lock in the same way across all of the lanes, and once the relative alignment of the lanes is known, the destination may communicate data out of received data buffers for each lane at an offset for each lane that matches the alignment.

Figure 6:
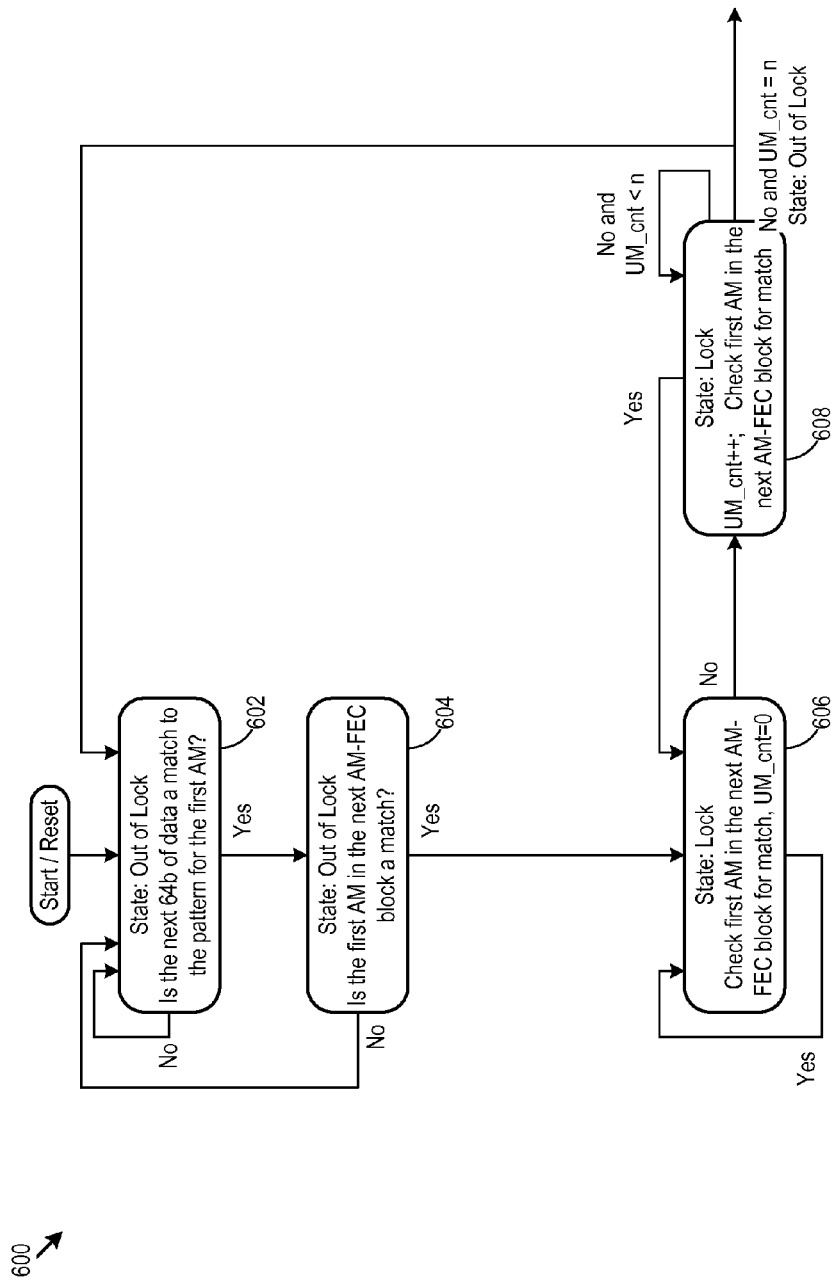
FIG. 6 shows logic in the form of a state transition diagram for matching alignment markers when the lock criteria is two consecutive matches. In this example, the first AM in each AM-FEC block is checked to determine block match, where an AM-FEC block is an FEC block that contains a group of Alignment Marker (AM) blocks.

FIG. 6 shows logic 600 in the form of a state transition diagram for matching AMs when the lock criteria is two consecutive matches. Starting from a reset or Out of Lock state, the logic 600 may determine whether there is a match on a MP in the next 64 b block of data (602). If not, the destination is still Out of Lock. If there is a match, the logic 600 determines whether the first AM in the next AM-FEC is also a match (604). Note that in this example, only the first AM in each AM group is checked to determine block match. However, in other implementations, the second check may happen at whatever FEC block and MP and lane the match sequence has established. In other words, the second match need not always be a match against the first AM that was already matched in (602). If there is no second match, then the destination receiver is still Out of Lock.

If there is a match at (604), then the destination may enter the Lock state, and continue to check for alignment. For example, the destination may continue to check for matches in the MP in AMs received in subsequent AM-FEC blocks (606). When there is no match, the logic 600 increments a mismatch count (UM_cnt) (608). When the mismatch count exceeds a pre-defined threshold 'n', e.g., 2, or 3, or 4, then the destination receiver may determine that Lock is lost, and transition to the Out of Lock state. Otherwise, if the destination is able to find a match, then it sets the mismatch count to zero, and continues checking.

Figure 7:
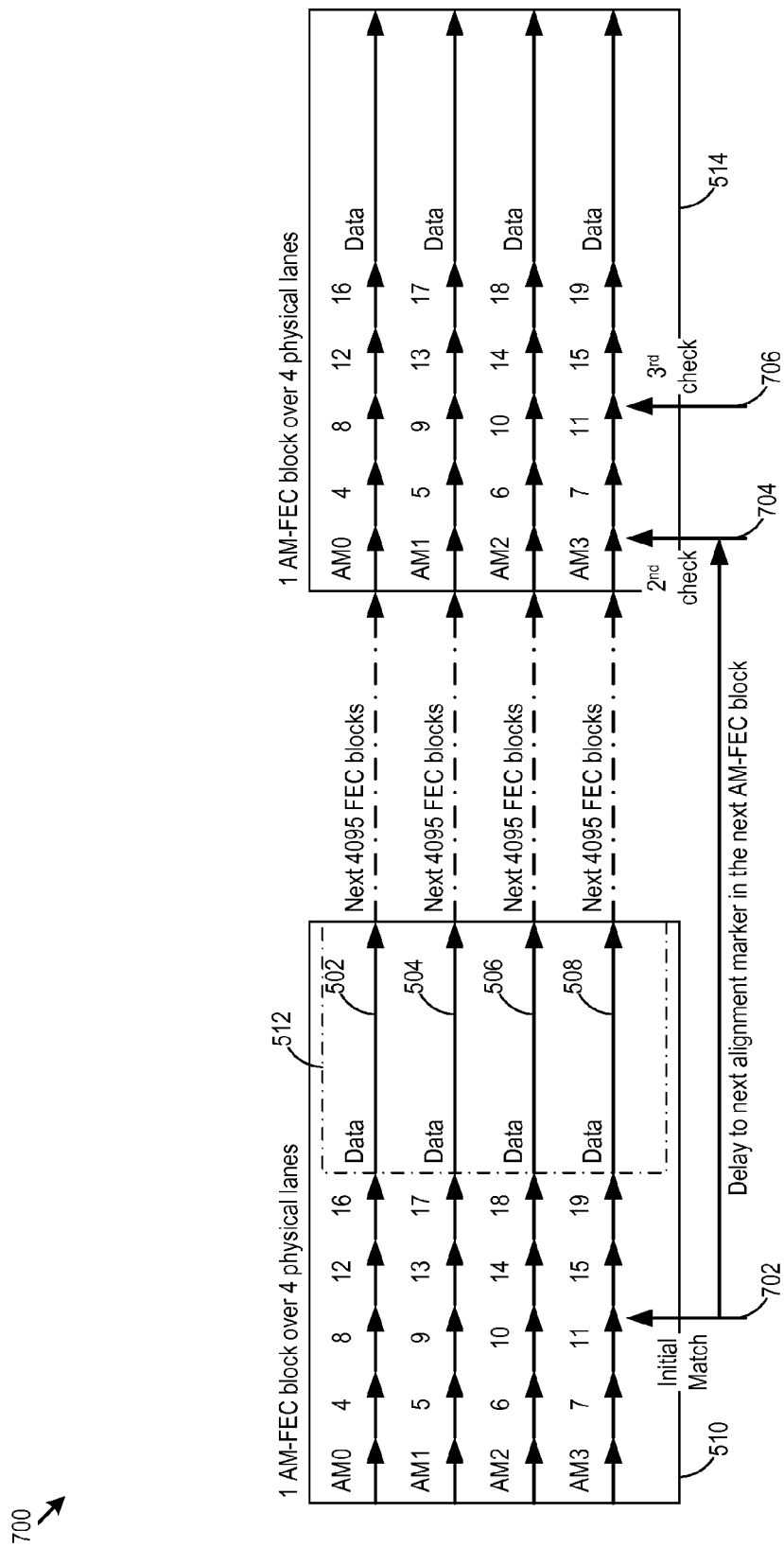
FIG. 7 shows a matching sequence for matching block, also in a scenario with four physical lanes and 20 virtual lanes of traffic. In this example, the destination checks the first and the third AM blocks in each group of five AM blocks for matches.

FIG. 7 shows a matching sequence 700, also in a scenario with four physical lanes 502, 504, 506, and 508 and 20 virtual lanes of traffic. In the example of FIG. 7, the destination checks the first and third AMs in the AM blocks for matches. In FIG. 7, the match sequence 700 has found a particular initial match 702 at the third AM block position (e.g., for AM11), and a consecutive match 704 at the first AM block position (e.g., for AM3) in the next group of AMs. In addition, the match sequence 700 has checked for and found a match at the non-sequential subsequent check point, namely the third check point 706. The third check point 706 is the third AM position (recall that the destination, in this example, searches for matches at the first and third AM positions). As will be discussed in more detail below, more generally, the match sequence may search for any number of consecutive matches against any AM blocks that meets the chosen lock criteria.

Figure 8:
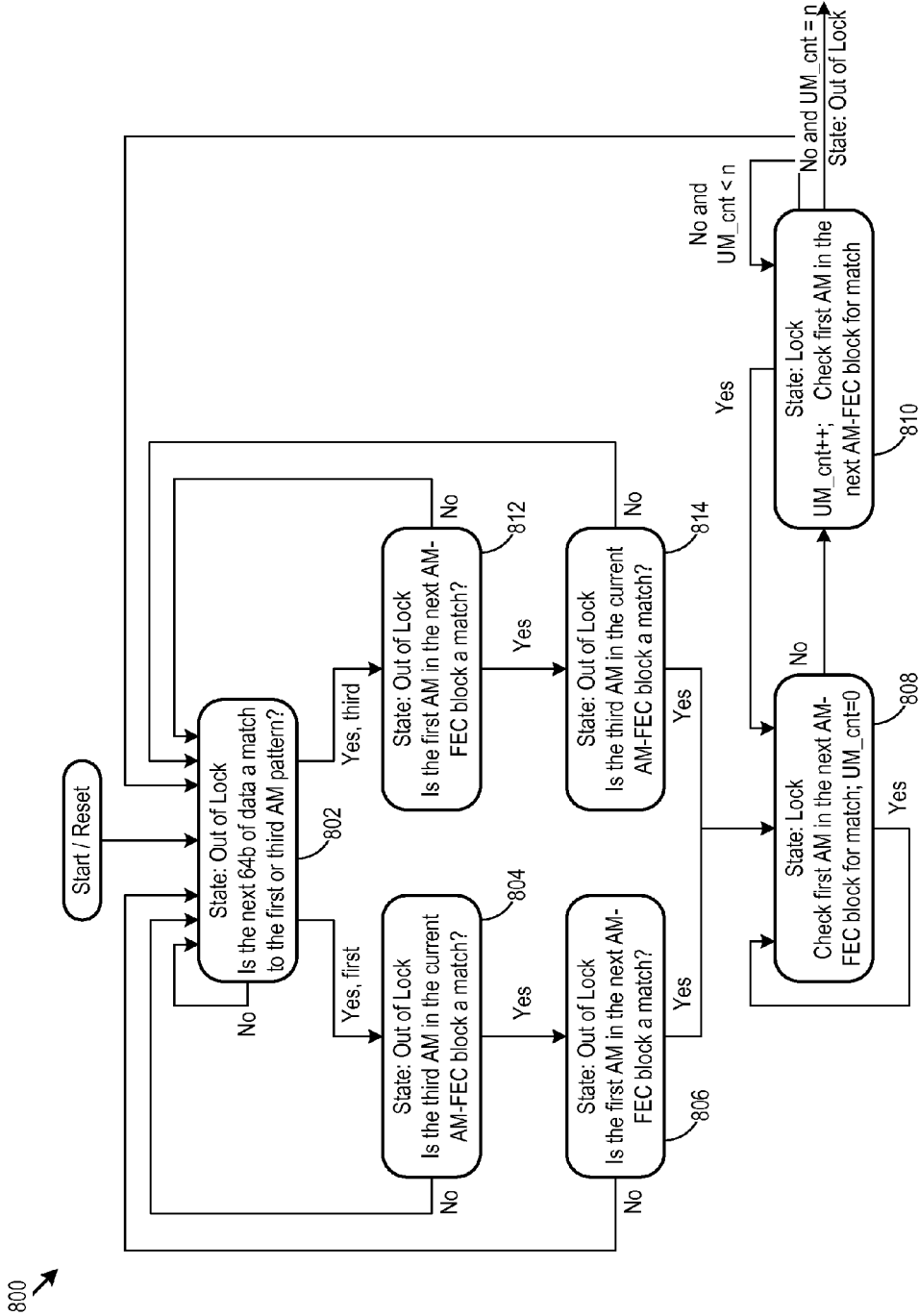
FIG. 8 shows logic in the form of a state transition diagram for matching alignment markers when the lock criteria is three consecutive matches.

FIG. 8 shows logic 800 in the form of a state transition diagram for matching AMs when the lock criteria is three consecutive matches, and where the destination tries to match only against the first or the third AM in the AM-FECs. Starting from a reset or Out of Lock state, the logic 800 may determine whether there is a match on the MP for the first or the third AM in the next 64 b block of data (802). If not, the destination is still Out of Lock. If there is a match on the first AM, the logic 800 determines whether the third AM in the same AM-FEC block is also a match (804). If there is no second match, then the destination receiver is still Out of Lock. If there is a match at (804), then the logic 800 may search for the third consecutive match (806). In particular, the logic 800 may determine whether the first AM in the next AM-FEC block that was analyzed at (804) is also a match. The destination must check the next AM-FEC block because the destination (in this example) only checks the first and third AMs in each AM-FEC. If there is no match, then the destination receiver is still Out of Lock.

If there is a match at (806), then the destination may enter the Lock state, and continue to check for alignment. For example, the destination may continue to check for matches at any monitor point, such as against the MP for the first AM received in subsequent AM-FEC blocks (808). When there is no match, the logic 800 increments a mismatch count (UM_cnt) (810). When the mismatch count exceeds a predefined threshold 'n', e.g., 2, or 3, or 4, then the destination receiver may determine that Lock is lost, and transition to the Out of Lock state. Otherwise, if the destination is able to find a match, then it sets the mismatch count to zero, and continues checking.

When it was the third AM that matched initially in (802), then the logic 800 may check for the next subsequent match against the first AM in the next AM-FEC block (812). The destination waits for the next AM-FEC because the destination only checks, in this example, for matches against the first and third AMs in any given AM-FEC block. If no match is found at the first AM in the next AM-FEC, then the destination is still out of lock. Otherwise, the destination attempts to match against the third AM in the same AM-FEC block (814) in which the second match was found at (812). If a match is found at (814), then the destination has established a lock.

Alternative Alignment Marker Match Techniques

The logic in the destination receiver may implement any of a wide variety of AM matching sequences, either more or less aggressive than the examples described above. More aggressive searches may lead to reduced mean time to lock or other performance benefits. One alternative is that once the logic has identified an initial match (e.g., the match 702), the logic may (more aggressively) check the next AM block in the received data sequence on the same physical lane and in the same AM-FEC block. As just three examples, the logic may handle: a) the current matched AM block is the number 3 or number 2 or number 1 AM block in the group; b) the current matched AM block is the number 4 AM block in the group; and c) the current matched block is the number 5 (i.e., the last AM block) AM group in the group.

In case a, the logic may check for two consecutive AM block matches at any selected AM block positions which may be in the current AM-FEC block or subsequent AM-FEC blocks. In case b, the logic may check the next 64 b block, and if it is a match to the next MP pattern, then check the first AM block in the next AM-FEC block for a match. In case c, after an initial match, the logic checks the first AM block in the next AM-FEC block, and may optionally check the second AM block in that next AM-FEC block if the 1st block is a match.

Figure 9:
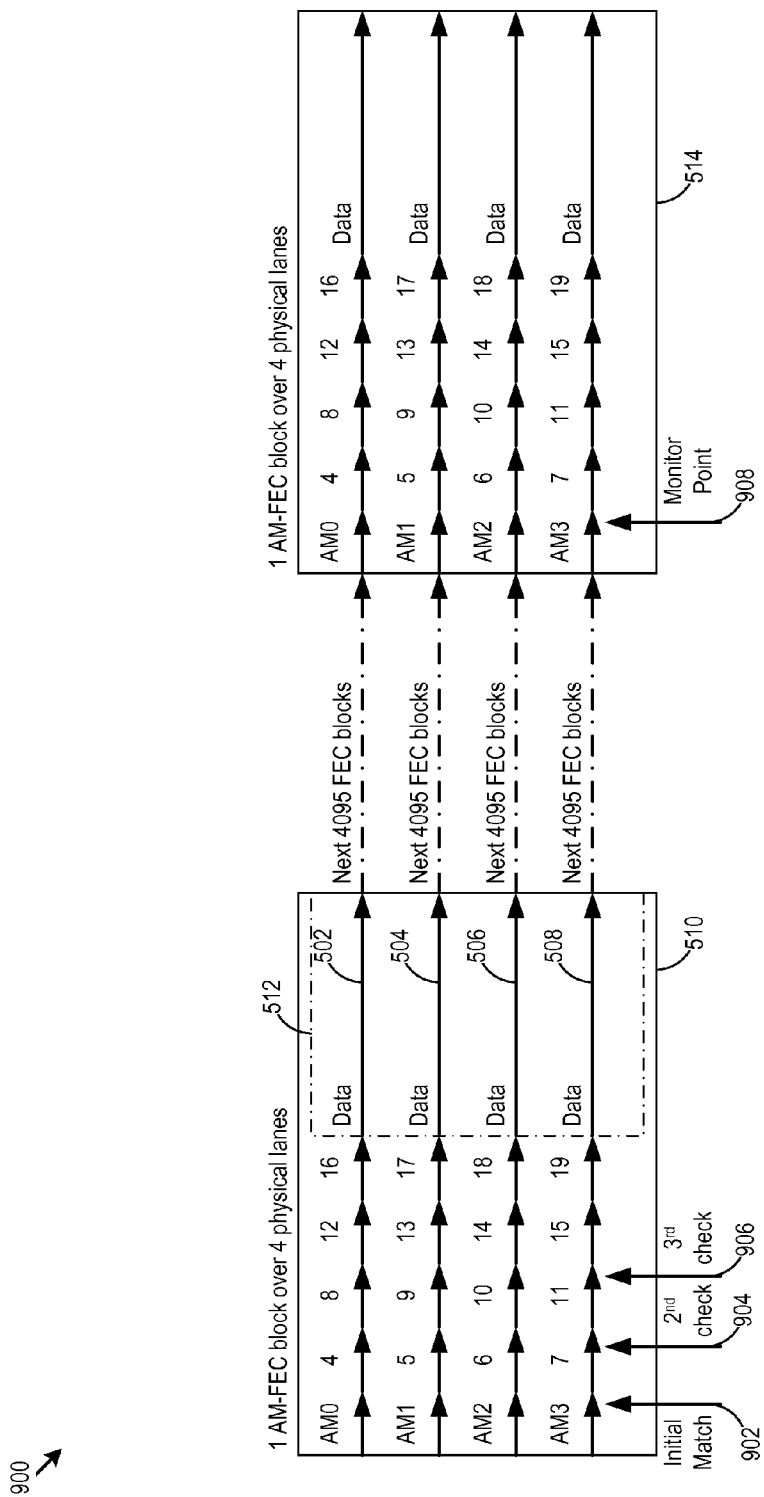
FIG. 9 shows an example matching sequence. In this example, the destination has checked for and found a match against the first three AM blocks in the current AM-FEC block.

FIG. 9 shows a matching sequence 900 for case a. FIG. 9 shows that within the same AM-FEC block 510, the more aggressive matching sequence finds a first match 902, a second match 904, and a third match 906. In this example, the destination checked for and has found matches against the first three AMs in the current AM-FEC. Alternatively, the matching sequence could search for 2, 4, 5, or some other number of matches against any specified combination of AMs (not just the first three), or try to meet any other lock criteria.

Figure 10:
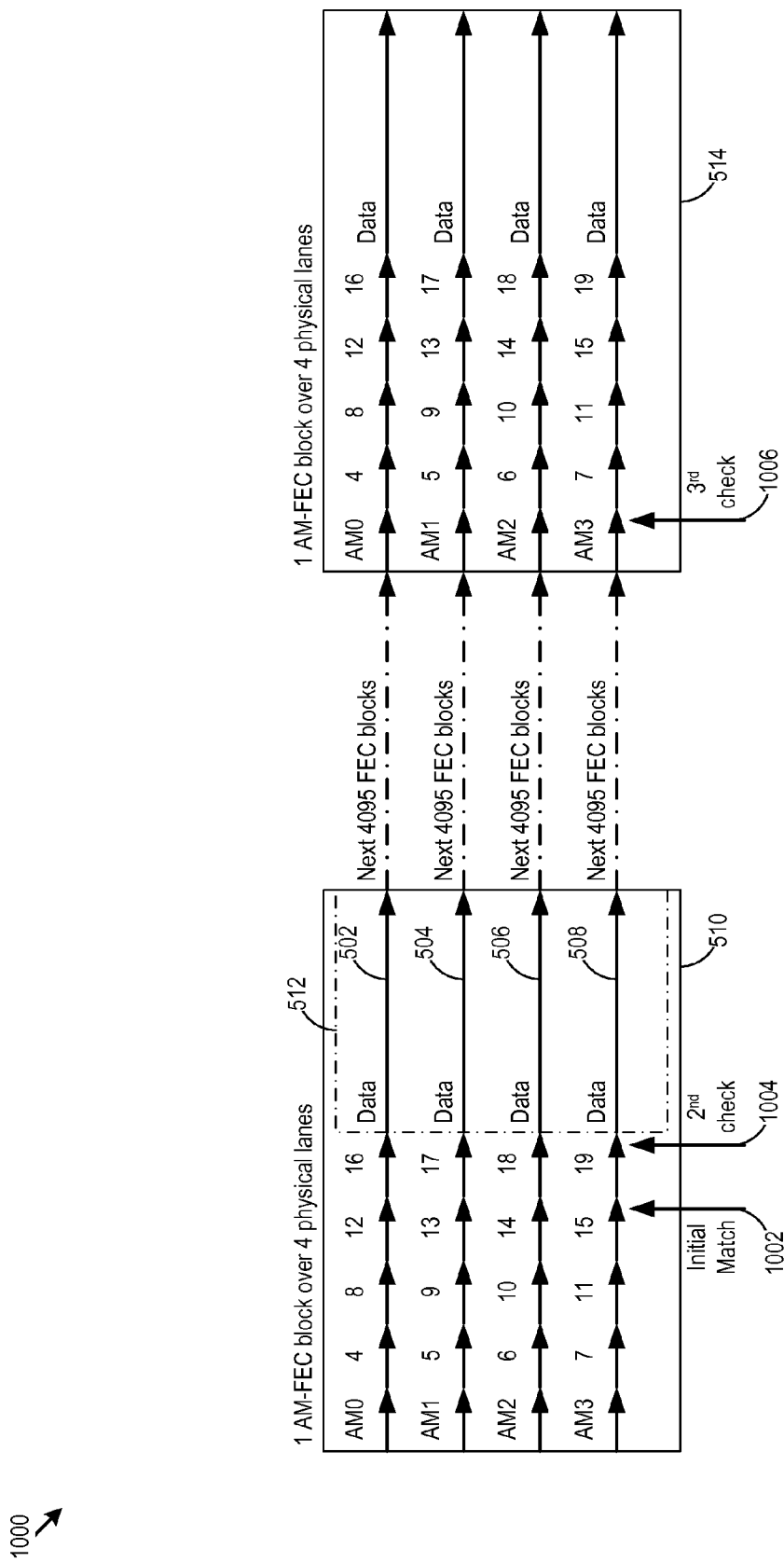
FIG. 10 shows an example matching sequence. In this example, the destination found a first match at the fourth AM block in the current AM-FEC block.

FIG. 10 shows a matching sequence 1000 for case b. As noted above for case b, the matching sequence 1000 finds an initial match 1002 at the fourth AM block position, and first subsequent match 1004 at the next (fifth) AM block position. The initial match 1002 and subsequent match 1004 are the fourth and fifth AMs in the AM-FEC block 510. The matching sequence 1000 then searches for the third consecutive match in the next AM-FEC block 514. That consecutive match is labeled as the third match 1006, which is the first AM block in the next AM-FEC block 514.

Figure 11:
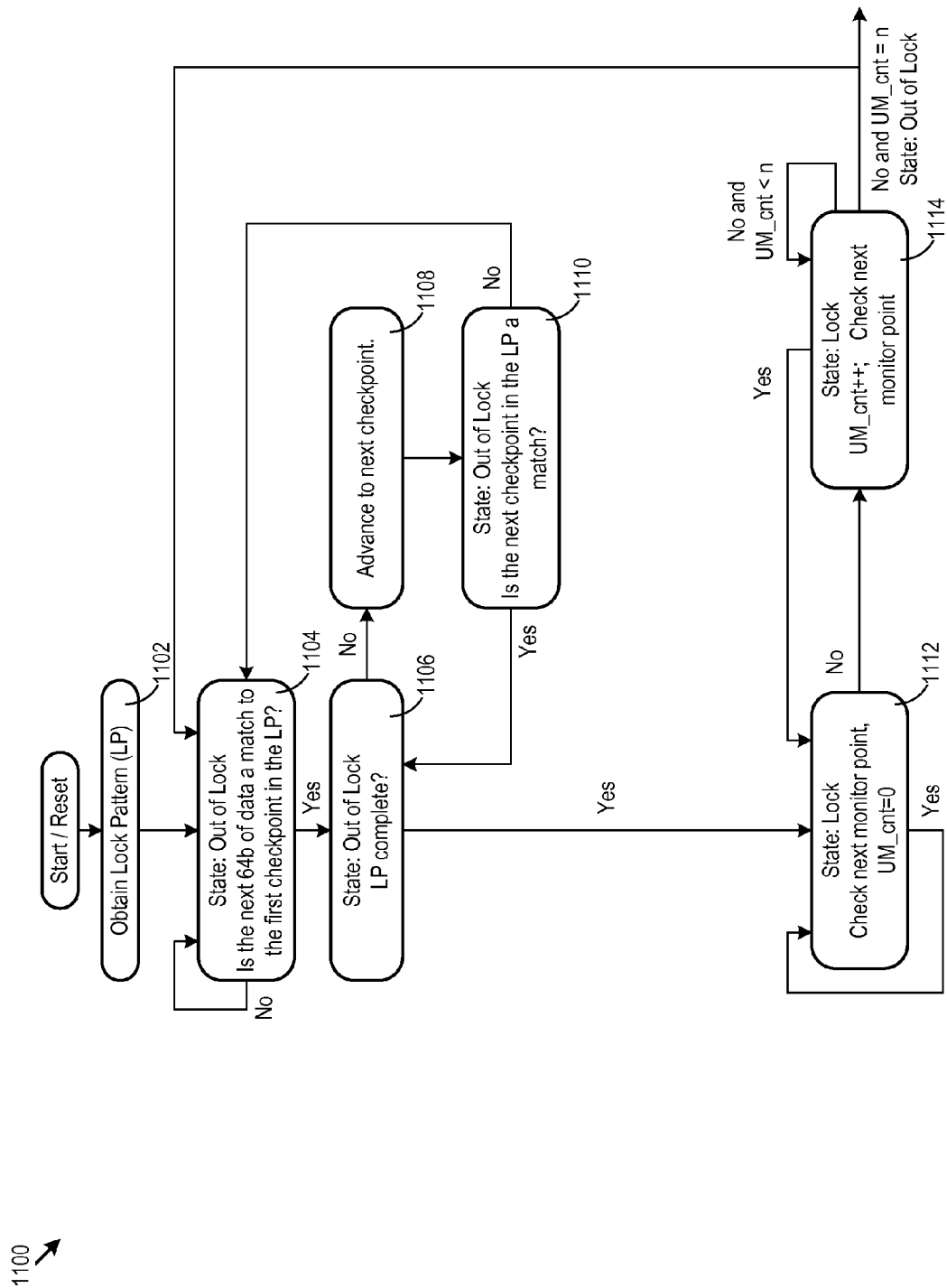
FIG. 11 shows logic in the form of a state transition diagram for matching marker patterns in alignment markers.

These more aggressive examples illustrated in FIGS. 9 and 10 help show that lock criteria may be flexibly established. A destination may implement any desired lock criteria at any particular point in time. FIG. 11 provides a more general state diagram for determining when lock is met.

In particular, FIG. 11 shows logic 1100 in the form of a state transition diagram for determining when lock is achieved. The logic 1100 may search for consecutive matches within the same AM-FEC block where an initial match is found when there are more AM in that AM-FEC block. Further, these searches may bridge to a subsequent AM-FEC block when the current AM-FEC block has no further AMs to match against, or whenever the lock criteria specifies to search for a subsequent match in a different AM-FEC.

The logic 1100 obtains a lock pattern (1102), e.g., established as a pre-programmed parameter or as a configuration parameter in a configuration file, as examples. The lock pattern may specify any or all of: which checkpoints (e.g., AMs) to match (which could be, e.g., any Boolean combination of AMs), where the checkpoints are located, the number and sequence of checkpoints to match, and the checkpoints to review for remaining in the lock state. For example, the lock pattern may be any of the examples given above. Some additional examples are:

1) lock is achieved when this lock pattern is met: First match: AM3, current AM-FEC block; Second Match AM11, current AM-FEC block; Third match: AM15, current AM-FEC block;

2) lock is achieved when this lock pattern is met: First match: AM3, current AM-FEC block; Second Match AM11, next AM-FEC block;

3) lock is achieved when this lock pattern is met: First match: AM3, current AM-FEC block OR AM7 current AM-FEC block; Second Match AM11, next AM-FEC block OR AM15, next FEC block;

4) lock is achieved when this lock pattern is met: First match: AM15, current FEC block; Second match: AM19, current FEC block; Third match: AM15, next FEC-block; Fourth match: AM19, next FEC-block.

Thus, the logic 1100, given the lock pattern, determines whether the next 64 b of data match the first checkpoint in the lock pattern (1104). If so, the logic 1100 determines whether the lock pattern is complete (1106). If not, then the logic 1100 advances to the next checkpoint (1108) (e.g., to the next AM block and AM-FEC specified in the lock pattern). Then, the logic 1100 tries to find a match at that next checkpoint (1110). If there is not match, the destination remains out of lock.

However, once all of the checkpoints in the lock pattern are matched, then the lock pattern is complete (1106). Once the lock pattern is complete, the destination enters the lock state. In the lock state, the destination checks the next monitor point for a match (1112). If a match is found, the destination remains in the lock state. However, if a match is not found (1114), then a counter is incremented, and further checks are made against any specified monitor points in the lock pattern. If the counter exceeds an out-of-lock threshold 'n', then the destination may determine that lock has been lost.

Tolerating symbol errors leads to a better tradeoff between false alignment probability and worst lock time compared to tolerating bit errors in block matching. Tolerating 4 half byte errors per block can essentially guarantee lock in only 4 group delays. The false alignment probability is low, with about a mean time of 130 years. The techniques may use symbol sizes such as 2, 3, 4, 6, or 8 bits, or other sizes.

Figure 12:
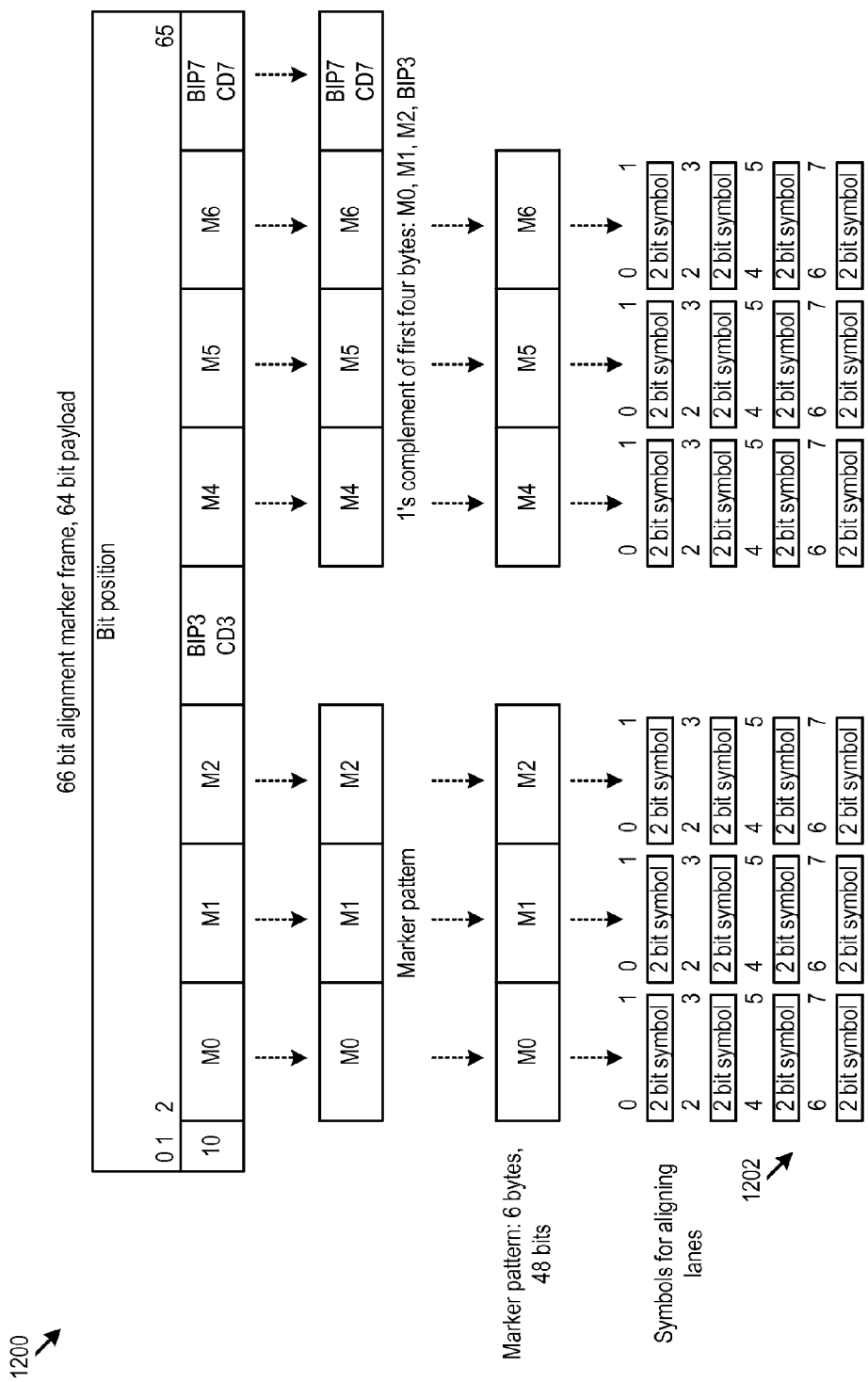
FIG. 12 shows an example of dividing the marker pattern into two bit symbols.
Figure 13:
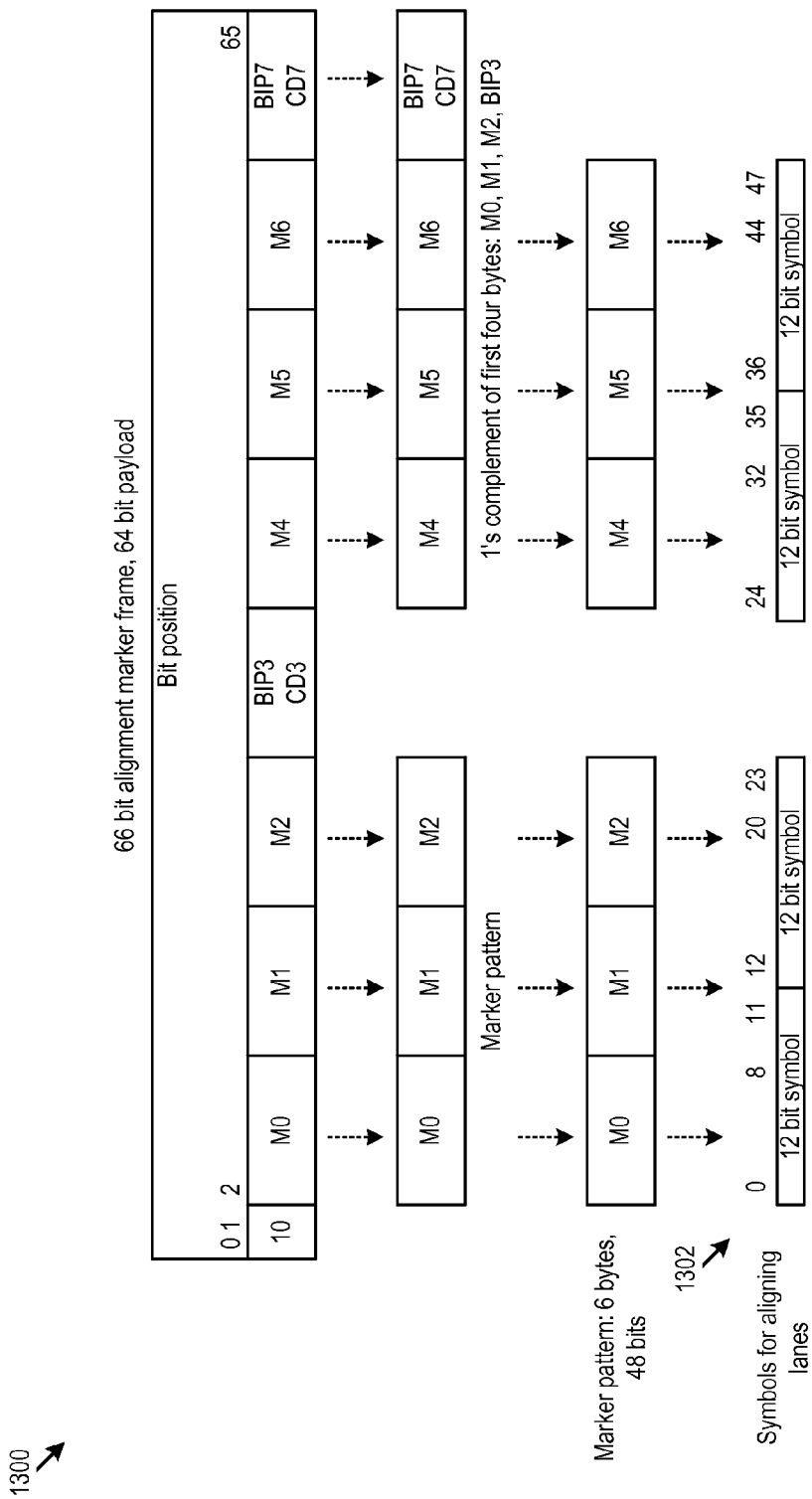
FIG. 13 shows an example of dividing the marker pattern into twelve bit symbols.

FIG. 12 shows an example 1200 of dividing the MP into two bit symbols 1202. Thus, for the six byte MP, there are 24 symbols that the destination receiver may try to match against, as opposed to the 12 half-byte symbols described above. FIG. 13 shows an example 1300 of dividing the MP into 12 bit symbols 1302 that cross MP byte boundaries.

Thus, for the six byte MP, there are 4 symbols that the destination receiver may try to match against, and tolerating some pre-determined number of symbols errors in the matching process.

Figure 14:
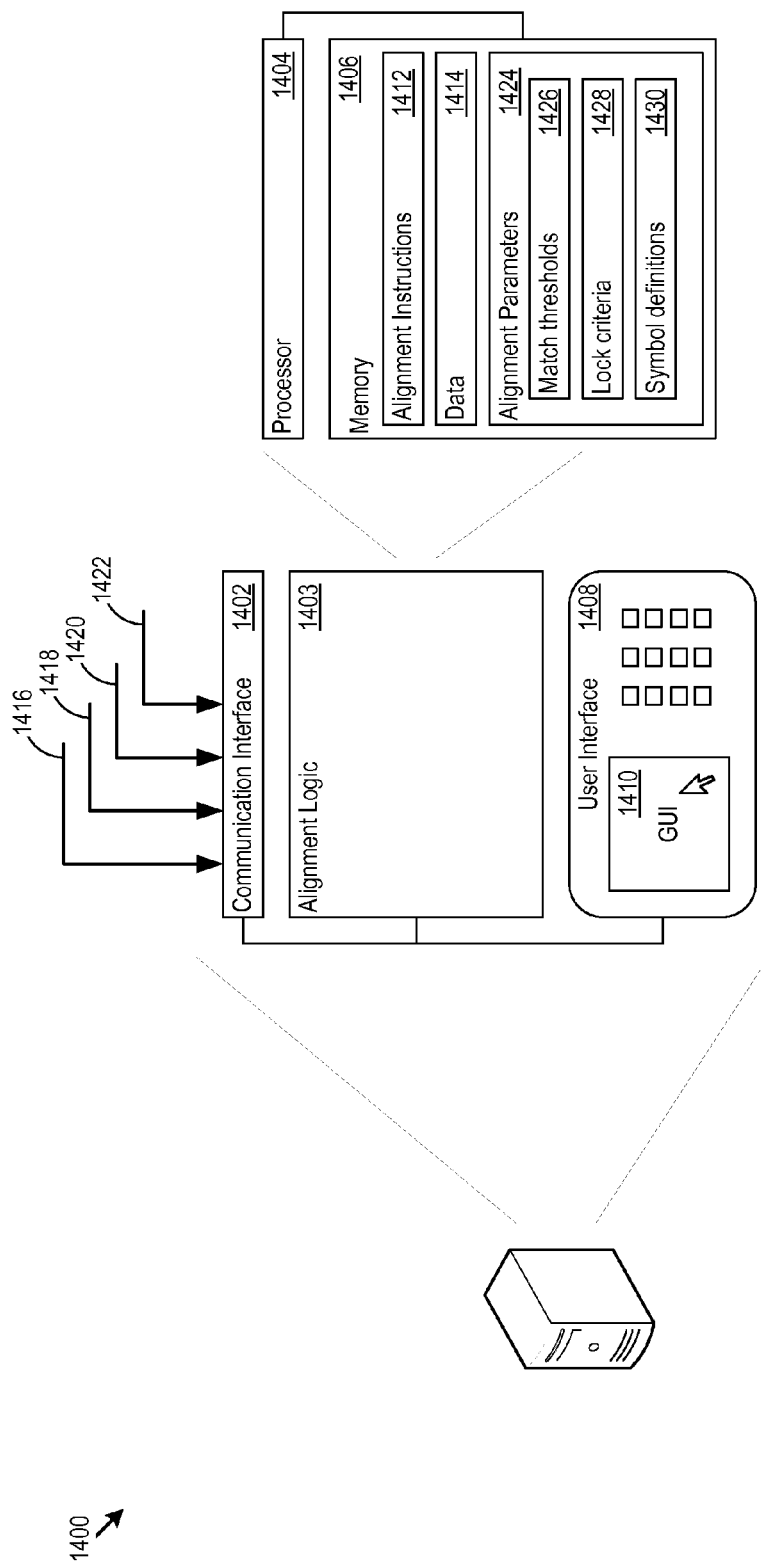
FIG. 14 shows an example of a system that may implement alignment over one or more physical lanes.

FIG. 14 shows an example of a system 1400 that may implement the techniques described above. The system 1400 may be a network switch, router, hub, or other part of the network fabric. The system 1400 may be implemented in any device that is a destination that receives data and performs data alignment, whether fixed or mobile. The system 1400 includes a communication interface 1402 (e.g., an Ethernet or other network interface), alignment logic 1403, and a user interface 1408. The user interface 1408 may display, for example, a graphical user interface 1410 and may accept data alignment parameters and display data alignment status. The alignment logic 1403 may be implemented in hardware, software, or both. In one implementation, the alignment logic 1403 is implemented in hardware state machines, to perform the processing noted above with regard to the state machine diagrams. Additionally or alternatively, the alignment logic 1403 may include a processor 1404 and a memory 1406. The memory 1406 may store alignment instructions 1412 (e.g., program instructions) for execution by the processor 1404.

The alignment logic 1403 may implement the techniques described above with regard to any of FIGS. 1-13. Thus, in one implementation, the alignment instructions 1412 obtain data (e.g., the FEC blocks) from the communication interface 1402, and store the data into data buffers for each lane of traffic. FIG. 14 shows four lanes 1416, 1418, 1420, and 1422 of data traffic received by the communication interface 1402 but there may be more or fewer lanes.

The alignment instructions 1412 operate according to the alignment parameters 1424 to match AMs and decide when there is a lock. Examples of alignment parameters include the symbol definitions, e.g., the number of bits per symbol 1430, lock criteria 1428 (e.g., 2 consecutive matches or 3 consecutive matches), match thresholds 1426 (e.g., whether the match process tolerates 3 symbol errors, 4 symbol errors, 4 bits errors, or some other threshold), the target lock delay (e.g., in terms of number of group delays), the desired false alignment probability, the number of consecutive matched blocks to find before declaring a lock, and other parameters that influence the operation of the alignment logic 1412. All of these parameters may vary on a dynamic basis to suit the current configuration goals of the system 1400. The alignment logic 1403 may communicate the lock condition to the user interface 1408 for display, may communicate the lock condition external to the system 1400, or may provide the lock condition to other logic in the system 1400 to be used in subsequent processing stages.

The techniques, methods, devices, and logic described above may be implemented in many different ways in many different combinations of hardware, software or both hardware and software. For example, all or parts of the techniques for matching or locking may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the techniques described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system that implements the techniques may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it will be apparent to those of ordinary skill in the art that many more embodiments and implementations are possible. Accordingly, the techniques are not to be restricted except in light of the attached claims and their equivalents.

What is claimed is:

1. A method comprising:
  receiving a first alignment marker for a first communication lane;
  determining a number of symbol errors in the first alignment marker;
  comparing the number of symbol errors in the first alignment marker to a lock threshold; and
  responsive to the comparison, determining whether to check a second alignment marker received from the first communication lane.

2. The method of claim 1 where determining whether to lock comprises:
  determining to lock when the number of symbol errors meets the lock threshold.

3. The method of claim 1 where determining the number of symbol errors in first alignment marker comprises analyzing symbols in first alignment marker against a predefined data pattern.

4. The method of claim 3, where the predefined data pattern comprises a marker pattern.

5. The method of claim 4, where the marker pattern comprises a virtual lane marker pattern.

6. The method of claim 3, where comparing the number of symbol errors in the data to the lock threshold comprises:
  tolerating a pre-defined number of the symbol errors in declaring a match to the predefined data pattern.

7. The method of claim 1, where determining whether to lock comprises:
  matching a pre-defined number of consecutive data patterns.

8. The method of claim 7, further comprising:
  reading alignment parameters that specify the pre-defined number of consecutive data patterns.

9. The method of claim 1, where determining whether to lock comprises:
  matching a pre-defined number of consecutive data patterns within a communication block in the data.

10. The method of claim 9, where the communication block comprises a Forward Error Correcting (FEC) block.

11. A device comprising:
a communication interface configured to receive data for a first communication lane, the data comprising an error correction block, the error correction block comprising a first alignment marker and a second alignment marker; and
circuitry in communication with the communication interface, the circuitry configured to:
compare symbols in the first alignment against a pre-defined pattern to determine a first number of symbol errors;
compare symbols in the second alignment marker against the predefined pattern to determine a second number of symbols errors;
determine whether to lock based on the comparisons; and
responsive to the determination, lock on the first communication lane when the first number of symbol errors is below a lock threshold and the second number of symbol errors is below the lock threshold.

12. The device of claim 11, where the predefined pattern comprises a virtual lane pattern.

13. The device of claim 11, where the circuitry is configured, during the comparison, to tolerate a pre-defined number of symbol errors while still finding a match against the pre-defined pattern.

14. A receiver comprising:
an input data buffer configured to hold data received over a first communication lane; and
alignment circuitry configured to:
treat a marker pattern as four-bit symbols;
attempt a match of the marker pattern against the data, and determine a number of symbol errors in the match;
when there are fewer than four symbol errors, determine that the match was successful; and
when two consecutive matches are found, determine that a lock has been achieved.

15. The receiver of claim 14, where:
the two consecutive matches bridge two different Forward Error Correcting (FEC) blocks in the data.

16. The receiver of claim 14, where:
the alignment circuitry performs marker pattern matching on a basis of symbols across four communication lanes, including the first communication lane, using data obtained from the four communication lanes.

17. The device of claim 11, wherein the first and second alignment markers comprise consecutive alignment markers within the first communication lane.

18. The device of claim 11, wherein the error correction block comprises a forward error correction block.

19. The device of claim 11, wherein the circuitry is further configured to remain out-of-lock when the first number of symbol errors is below a lock threshold and the second number of symbol errors is above the lock threshold.

20. The device of claim 11, wherein the predefined pattern comprises a virtual lane pattern assigned to the first communication lane.

* * * * *

UNITED STATES PATENT AND TRADEMARK OFFICE
CERTIFICATE OF CORRECTION

| | | |
|---|---|---|
| PATENT NO. | : 9,059,850 B2 | Page 1 of 1 |
| APPLICATION NO. | : 13/655748 | |
| DATED | : June 16, 2015 | |
| INVENTOR(S) | : Zhongfeng Wang | |

It is certified that error appears in the above-identified patent and that said Letters Patent is hereby corrected as shown below:

In the Claims

Column 11, claim 11, line 11, after "the first alignment" insert --marker--.

Signed and Sealed this
Tenth Day of November, 2015

Michelle K. Lee
*Director of the United States Patent and Trademark Office*